United States Patent
Hung et al.

(10) Patent No.: US 7,199,018 B2
(45) Date of Patent: Apr. 3, 2007

(54) PLASMA ASSISTED PRE-PLANARIZATION PROCESS

(75) Inventors: Yung-Tai Hung, Chiayi (TW); Chun-Fu Chen, Taipei (TW); Yun-Chi Yang, Cyonglin Township, Hsinchu County (TW); Chin-Hsiang Lin, Hsinchu (TW); Chen-Wei Liao, Jhushan Township, Nantou County (TW)

(73) Assignee: Macronix International Co., Ltd., Hsinchu (TW)

( * ) Notice: Subject to any disclaimer, the term of this patent is extended or adjusted under 35 U.S.C. 154(b) by 116 days.

(21) Appl. No.: 10/837,528

(22) Filed: Apr. 30, 2004

(65) Prior Publication Data

US 2005/0003668 A1   Jan. 6, 2005

Related U.S. Application Data

(60) Provisional application No. 60/467,238, filed on Apr. 30, 2003.

(51) Int. Cl.
   *H91L 21/76* (2006.01)

(52) U.S. Cl. ................ 438/424; 438/692; 438/693; 438/E21.548

(58) Field of Classification Search ............... 438/424, 438/690–693
See application file for complete search history.

(56) References Cited

U.S. PATENT DOCUMENTS

| | | | |
|---|---|---|---|
| 5,721,172 A * | 2/1998 | Jang et al. .................. 438/424 |
| 6,242,322 B1 * | 6/2001 | Chen et al. ................. 438/424 |
| 6,424,019 B1 * | 7/2002 | Hsia et al. .................. 257/499 |
| 6,514,821 B1 | 2/2003 | Huang | |
| 6,534,407 B2 | 3/2003 | Chang | |
| 6,561,876 B1 | 5/2003 | Tateyama et al. | |
| 6,576,554 B2 | 6/2003 | Matsui et al. | |
| 2002/0090825 A1 * | 7/2002 | Nagai ......................... 438/700 |
| 2003/0166381 A1 * | 9/2003 | Lee et al. ...................... 451/41 |
| 2003/0176151 A1 * | 9/2003 | Tam et al. ..................... 451/41 |

* cited by examiner

*Primary Examiner*—Dung A. Le
(74) *Attorney, Agent, or Firm*—Knobbe, Martens, Olson & Bear, LLP

(57) ABSTRACT

The present invention is related to methods of processing a semiconductor device. A plasma vapor deposition process is used to fill a trench with an oxide layer, wherein sharp corners are formed by the oxide layer. A pre-planarization sputtering process is performed to reduce the oxide layer corner sharpness. A planarization process is performed using polishing.

9 Claims, 5 Drawing Sheets

PLASMA ASSISTED PRE-PLANARIZATION PROCESS

PRIORITY CLAIM

This application claims the benefit under 35 U.S.C. 119(e) of U.S. Provisional Application No. 60/467,238, filed Apr. 30, 2003, the contents of which are incorporated herein in their entirety.

BACKGROUND OF THE INVENTION

1. Field of the Invention

The present invention is related to semiconductor processing, and in particular to semiconductor devices and the manufacturing thereof using plasma assisted oxide processes and chemical mechanical polishing.

2. Description of the Related Art

The fabrication of semiconductor trenches can result in sharp trench corners at the top of the trench walls. These sharp trench corners can interfere with the deposition of layers of uniform thickness thereon, and so can hinder the formation of layers adjacent to the trench.

Some conventional processes first form a trench, then utilize a high-density plasma (HDP) vapor deposition process to fill the trench to provide shallow trench isolation (STI). A chemical mechanical polishing (CMP) planarization process is then conventionally used to reduce the sharp trench corners, as well as to reduce dishing and nitride erosion. However, much of the slurry used during the CMP process is sometimes wasted or inefficiently used. This is particularly true, by way of example, of Cerium Oxide ($CeO^2$) slurry, which is sensitive to topology, such as sharp corners. Thus, in some instances, it would be advantageous to enhance the polishing efficiency and to reduce slurry waste by reducing the sharp trench corners before performing CMP planarization.

SUMMARY OF THE INVENTION

One embodiment of the present invention provides a pre-CMP planarization process using a sputtering and/or a reverse diffusion process. As compared to many conventional techniques, embodiments of the present invention allows for greater Silicon Nitride (SiN) uniformity, more efficient use of slurry materials, and a faster CMP process. The present invention can be used with a wide variety of semiconductor applications, including memory products, such as FLASH memory, and the like.

One embodiment of the present invention is a method of processing a semiconductor device having trenches, the method comprising: using a plasma vapor deposition process to fill a trench with an oxide layer, wherein sharp corners are formed by the oxide layer; performing a pre-planarization sputtering process to reduce the oxide layer corner sharpness; and performing a planarization process on the oxide layer using a slurry.

Another embodiment of the present invention is a method of processing a semiconductor, the method comprising: using a vapor deposition process to deposit a first material in an isolation trench, wherein sharp corners are formed by the first material; performing a pre-planarization plasma bombardment process to reduce corner sharpness; and performing a planarization process on the first material using a polishing material.

Yet another embodiment of the present invention is a method of processing a semiconductor device, the method comprising: using a vapor deposition process to deposit a first material in a recess, wherein sharp corners are formed by the first material; performing a pre-planarization plasma bombardment process to reduce corner sharpness; removing a portion of the first material using a reverse diffusion process; and performing a planarization process on the first material using a polishing material.

BRIEF DESCRIPTION OF THE DRAWINGS

Example embodiments of the present invention are described below in connection with the accompanying drawings.

DETAILED DESCRIPTION OF PREFERRED EMBODIMENTS

As will be described in greater detail herein, one embodiment of the present invention provides a pre-STI CMP planarization process and enhanced uniformity. As compared to many conventional techniques, embodiments of the present invention allows for greater SiN uniformity, more efficient use of slurry materials, and a faster CMP process.

Figure 1:
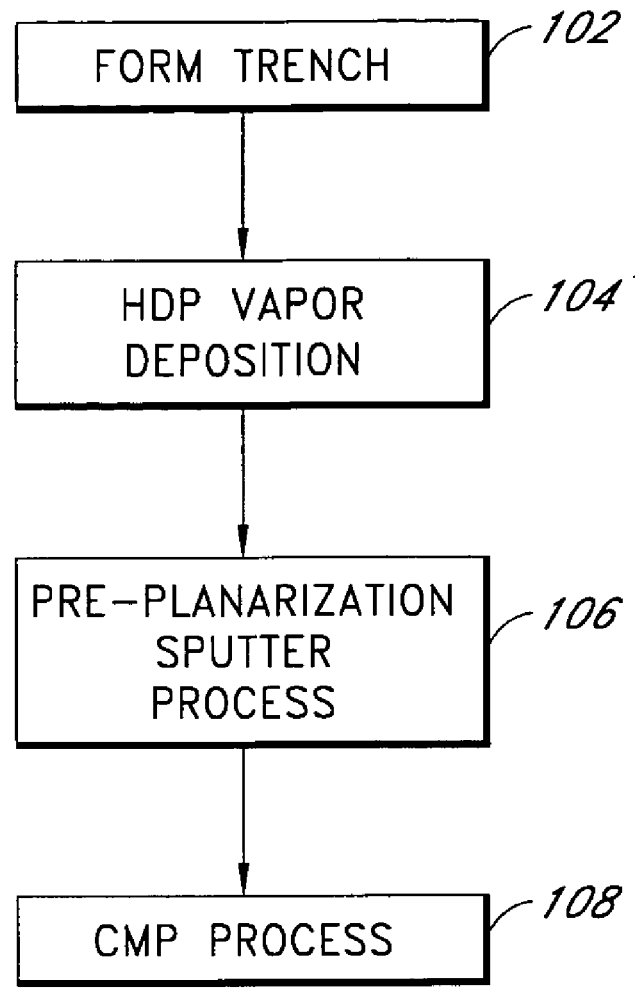
FIG. 1 illustrates a first example process including a pre-planarization process.

With reference to example FIG. 1, at state 102 a trench is formed. By way of example, the trench may be intended as shallow isolation trench used to isolate active semiconductor regions. The trenches may be formed using conventional techniques, such as positive masks, or new or unconventional techniques. Then, at state 104, a deposition process, such as a high-density plasma (HDP) oxide vapor deposition process is used to fill the trench with an insulating material, such as an HDP oxide layer or film.

At state 106, a pre-planarization sputtering process is then performed. The sputtering process, by way of example, can optionally be performed in-situ. The sputtering process can be performed in an HDP chemical vapor deposition apparatus or using a separate sputtering tool that provides plasma bombardment. The sputtering process acts as a plasma bombardment which can remove, round, or otherwise reduce the sharpness of the sharp trench corners that would be difficult for a CMP process to planarize. Advantageously, this reduces the amount of slurry that would otherwise needed to round the sharp edges during the CMP planarization process and reduces the CMP process time. By way of example, and not limitation, in one embodiment the slurry and process time will be reduced to around 40% of the slurry usage and process timed utilized by a traditional CMP process without a pre-planarization process. At state 108, the CMP planarization process is then performed in order to remove excess oxide.

The sputtering process 106 can be performed in an HDP chemical vapor deposition (CVD) apparatus or using a separate sputtering tool that provides plasma bombardment.

The process gas can be, by way of example, $O^2$, $N^2$, or an inert gas, such as helium (He) or argon (Ar). Other appropriate gases, or mixtures thereof, can also be used.

The sputtering deposition parameters include, by way of example, bias power, which may be the dominating parameter, process time, and gas flow rate. A typical temperature range that can be used is 300° C. to 800° C. The process time is related to the bias power, wherein the greater the bias power, generally the lower the process time. A proper sputter condition is selected for the HDP diffusion oxide thickness. By way of example, the following parameters may be used:

HDP: 5.2K
Gas source: $O^2$/He
Bias power: 1000 watts
Process time: 30 seconds
Temp: 700° C.

By way of example, the CMP planarization process 108 can utilize a Ceria-based slurry, such as a $CeO^2$ slurry which has low scratch defectivity and a high removal rate of oxide film, though other slurries can be used as well.

Advantageously, the process described above and illustrated in FIG. 1 can reduce the CMP polishing time significantly. For example, the processing time can be 40% or less of that needed by conventional techniques.

Figure 2:
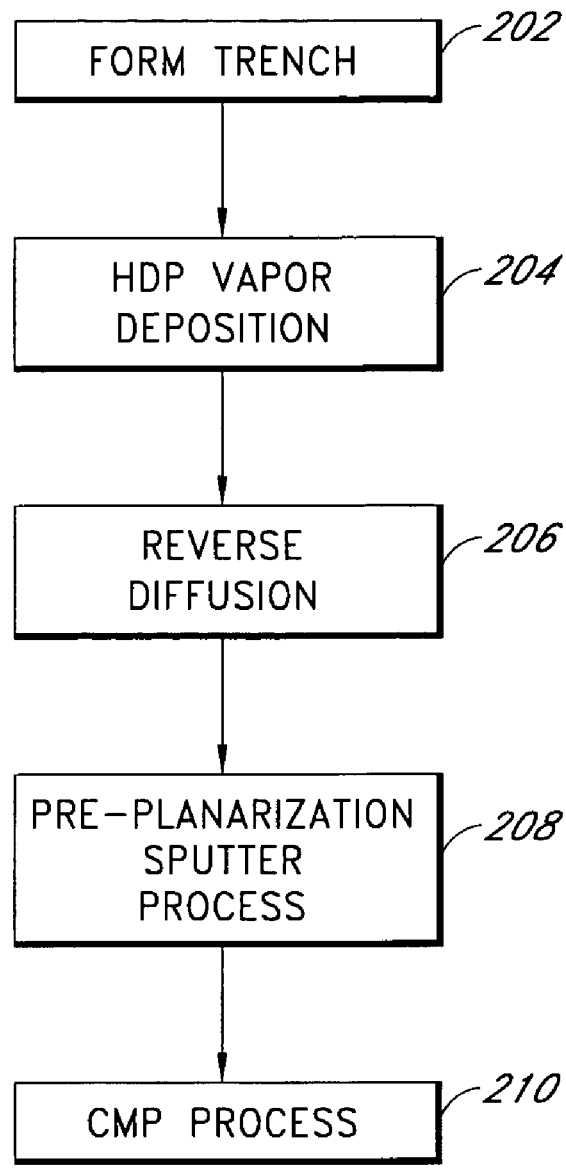
FIG. 2 illustrates a second example process including a pre-planarization and reverse diffusion process.

Another embodiment utilizing reverse diffusion will now be described with reference to FIG. 2. As described below, a reverse diffusion process, sometimes referred to as an RDF process, is used to remove bulk HDP oxide. At state 202 a trench is formed. By way of example, the trench may be an intended as shallow isolation trench used to isolate active semiconductor regions. Then, at state 204, a deposition process, such as a high-density plasma (HDP) oxide vapor deposition process, is used to fill the trench with an insulating material, such as an HDP oxide film.

At state 206, a reverse diffusion process is performed to remove bulk HDP oxide resulting from the deposition process. Advantageously, the RDF process removes bulk oxide to provide SiN uniformity that the CMP process may not be able to adequately provide. The SiN layers, by way of example, may be etch stop or barrier layers. The RDF process can use a reverse-tone mask to expose the bulk HDP oxide for etch back. The bulk HDP oxide is etched and a shallow trench-like pattern with sharp corners is formed.

At state 208, a pre-planarization or sputtering process is then performed. The sputtering process, by way of example, can optionally be performed in-situ. As similarly described above, the sputtering process can be performed in an HDP chemical vapor deposition apparatus or using a separate sputtering tool to provide plasma bombardment. The sputtering process acts as a plasma bombardment which can remove and/or round sharp. trench corners that would otherwise be difficult for the CMP process to planarize. As similarly described above, this reduces the amount of slurry that would otherwise needed to round the sharp edges during the CMP planarization process and reduces the CMP process time. At state 210, the CMP planarization process is then performed in order to remove the excess oxide.

Figure 3:
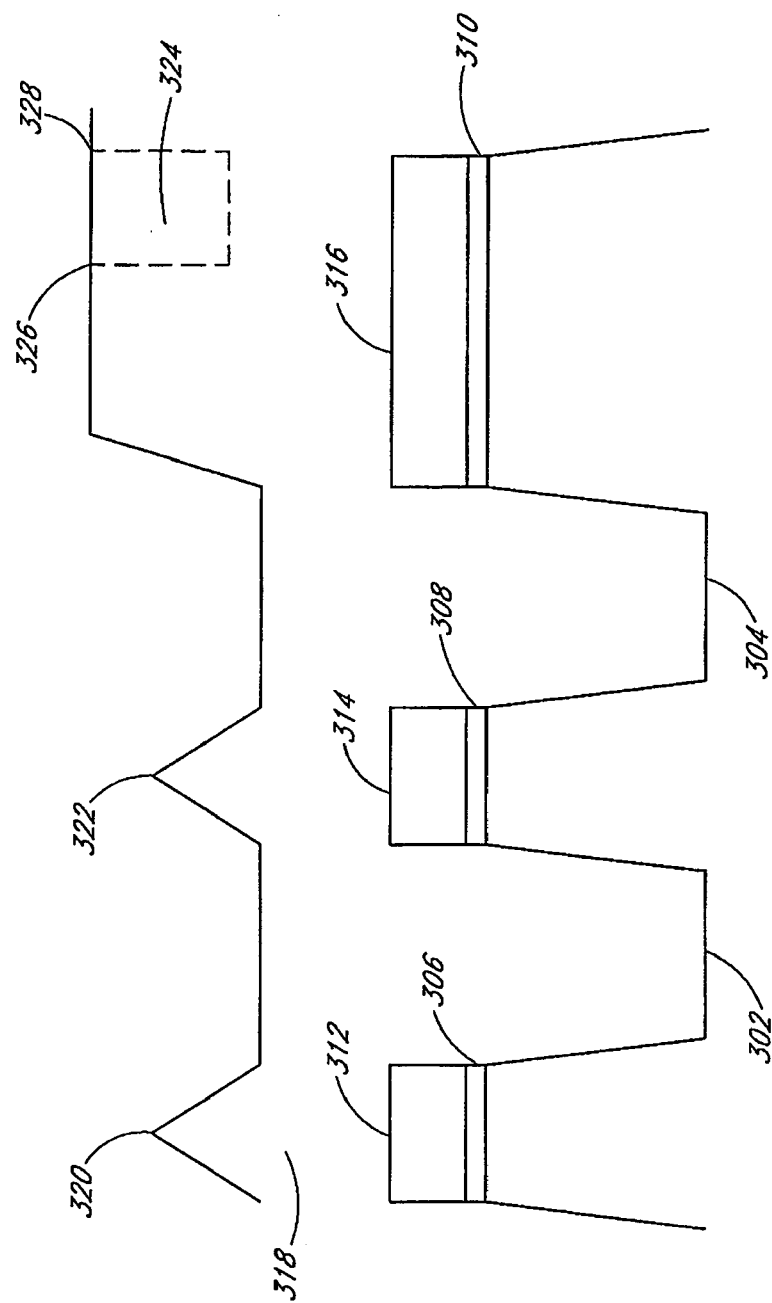
FIG. 3 illustrates an example cross-sectional view of a semiconductor with trenches having sharp corners.

FIG. 3 illustrates an example cross-sectional view of a semiconductor having sharp trench corners. For clarity, diagrammatic representations of integrated circuit structures are shown. Thus, the actual appearance of the fabricated structures may appear different while still utilizing embodiments of the present invention. Additional structures, such as those known to one of ordinary skill in the art, have not been included to maintain the clarity of the figure.

The semiconductor can include a substrate, such as one formed from monocrystalline silicon or of other materials. Trenches 302, 304 are fabricated using, by way of example, using masks and photoresist. As illustrated, the trenches form a recess and have sidewalls. Oxide pads 306, 308 310 are deposited. Silicon Nitride (SiN) layers 312, 314, 316 are formed over the pads 306, 308, 310. An HDP oxide layer 318 is deposited over the trenches 302, 304, over the pads 306, 308, 310, and over the SiN layers 312, 314, 316. As illustrated, resultant sharp corners 320, 322 are formed. Similarly, once the bulk oxide 324 is removed by RDF, sharp corners 326, 328 will also be formed. As similarly discussed above, unless the sharp corners are removed or rounded, a significant amount of slurry and time will be needed during the CMP process to round or remove the sharp corners. In addition, uniformity might be adversely affected by the sharp corners.

Figure 4A:
FIGS. 4A–B illustrate example cross-sectional micrograph views of a semiconductor with trenches before and after a sputtering process and a CMP process are performed.
Figure 4B:

FIGS. 4A–B illustrate example cross-sectional micrograph views of a semiconductor with trenches before and after a sputtering process is performed. The following parameters were used in this example:

HDP: 5.2K
Gas source: $O^2$/He
Bias power: 1000 watts
Process time: 30 seconds
Temp: 700° C.

As illustrated in FIGS. 4A–B, sharp corner 402 in FIG. 4A is significantly reduced in FIG. 4B after the sputtering process described herein were performed.

Figures 5A, 5B:
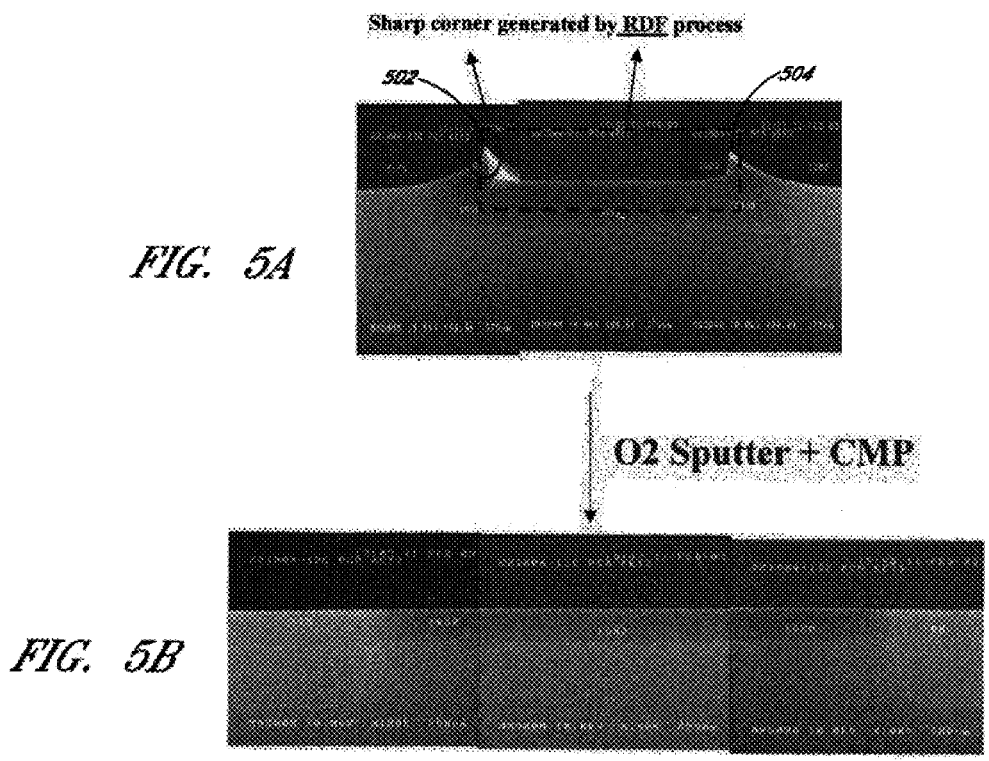
FIGS. 5A–B illustrate example cross-sectional micrograph views of a semiconductor with a trench having sharp corners generated by an RDF process, and the resultant cross section after the sputtering process and a CMP process are performed.

FIGS. 5A–B illustrate additional example cross-sectional micrograph views of a semiconductor. As illustrated in FIG. 5A, sharp corners 502, 504 have been formed by an RDF process. FIG. 5B illustrates the resultant cross section after the sputtering process and a CMP process are performed with the resultant planarization.

The foregoing processes can be used with a wide variety of semiconductor applications, including memory circuits, products and the like.

Those of ordinary skill in the art will appreciate that the methods and designs described above have additional applications, and that the relevant applications are not limited to those specifically recited above. Also, the present invention can be embodied in other specific forms without departing from the essential characteristics as described herein. The embodiments described above are to be considered in all respects as illustrative only, and not restrictive in any manner.

What is claimed is:

1. A method of processing a semiconductor device, the method comprising:
    using a vapor deposition process to deposit a first material in a recess, wherein sharp corners are formed by the first material;
    performing a pre-planarization plasma bombardment process to reduce corner sharpness;
    removing a portion of the first material using a reverse diffusion process; and
    performing a planarization process on the first material using a polishing material.

2. The method as defined in claim 1, wherein the vapor deposition process is a plasma vapor deposition process.

3. The method as defined in claim 1, wherein the polishing material is a slurry.

4. The method as defined in claim 1, wherein the recess is a shallow isolation trench.

5. The method as defined in claim 1, wherein the pre-planarization plasma bombardment process is performed in-situ.

6. The method as defined in claim 1, wherein the pre-planarization plasma bombardment process is performed using an HDP chemical vapor deposition apparatus.

7. The method as defined in claim 1, wherein the pre-planarization plasma bombardment process is performed using at least one of $O^2$, $N^2$, helium, and argon.

8. The method as defined in claim 1, wherein the first material is an oxide.

9. The method as defined in claim 1, further comprising forming a silicon nitride layer.

* * * * *